(12) United States Patent
Lee et al.

(10) Patent No.: US 7,619,452 B2
(45) Date of Patent: Nov. 17, 2009

(54) MUTUAL CHARGE CANCELLING SAMPLE-RESET LOOP FILTER FOR PHASE LOCKED LOOPS

(75) Inventors: Hyung-Jin Lee, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/079,786

(22) Filed: Mar. 28, 2008

(65) Prior Publication Data

US 2009/0243660 A1  Oct. 1, 2009

(51) Int. Cl.
  *H03L 7/06* (2006.01)
  *H03K 5/00* (2006.01)
(52) U.S. Cl. .................. 327/157; 327/148; 327/558
(58) Field of Classification Search .............. 327/94, 327/534–537, 156–158, 147–149, 558
See application file for complete search history.

(56) References Cited

U.S. PATENT DOCUMENTS 7,142,037 B2 * 11/2006 Josefsson ............... 327/337
7,450,041 B2 * 11/2008 Lin et al. .................. 341/118

OTHER PUBLICATIONS

Maneatis, John G., "FA 8.1: Low-Jitter and Process-Independent DLL and PLL Based on Self Biased Techniques", *1996 IEEE International Solid-State Conference*, (1996), 3 pages.
Maneatis, John G., "Self-Biased High-Bandwidth Low-Jitter 1-to-4096 Multiplier Clock Generator PLL", *IEEE Journal of SOlid-State Circuits*, vol. 38, No. 11, (Nov. 2003), pp. 1795-1803.

* cited by examiner

*Primary Examiner*—Dinh T. Le
(74) *Attorney, Agent, or Firm*—Ryder IP Law; Douglas J. Ryder

(57) ABSTRACT

In general, in one aspect, an apparatus includes a phase frequency detector, a charge pump, a voltage controlled oscillator, an integral capacitor to maintain an integral charge and provide an integral voltage, and a mutual-charge canceling sample reset (MCSR) capacitor to maintain a proportional charge and provide a proportional voltage each reference clock cycle. The MCSR includes a first proportional capacitor, a second proportional capacitor in parallel to, and having substantially identical capacitance value as, the first proportional capacitor, a first set of switches to provide direct coupling of the first and second proportional capacitors, and a second set of switches to provide cross coupling of the first and second proportional capacitors. The first and second set of switches alternatively turn on and off every reference clock cycle so that set of switches coupling the first and second proportional capacitors alternates every reference clock cycle.

15 Claims, 5 Drawing Sheets

MUTUAL CHARGE CANCELLING SAMPLE-RESET LOOP FILTER FOR PHASE LOCKED LOOPS

BACKGROUND

The phase-locked loop (PLL) is a versatile electronic circuit used in a wide variety of applications, including frequency synthesis, clock recovery, clock multiplication, and clock regeneration. In large, high-speed integrated circuits (including application-specific integrated circuits, field-programmable gate arrays, network processors, and general purpose microprocessors), PLLs have become commonplace. On-chip phase-locked loop clock multipliers are used on these chips to generate a high-frequency clock signal that is a multiple of, and in phase with, a system clock or I/O clock. PLLs may also be used on these chips to resynchronize and realign clocks in deep clock distribution trees to reduce clock skew.

PLLs utilize a phase frequency detector (PFD) to compare a reference clock to a clock generated by a voltage controlled oscillator (VCO) and feed back to the PFD. Reference clock feedthrough degrades high frequency phase noise performance of PLLs so that they achieve worse short term clock jitter. PLLs may implement sample-reset techniques to improve the reference clock feedthrough performance.

BRIEF DESCRIPTION OF THE DRAWINGS

The features and advantages of the various embodiments will become apparent from the following detailed description in which.

DETAILED DESCRIPTION

Figure 1:
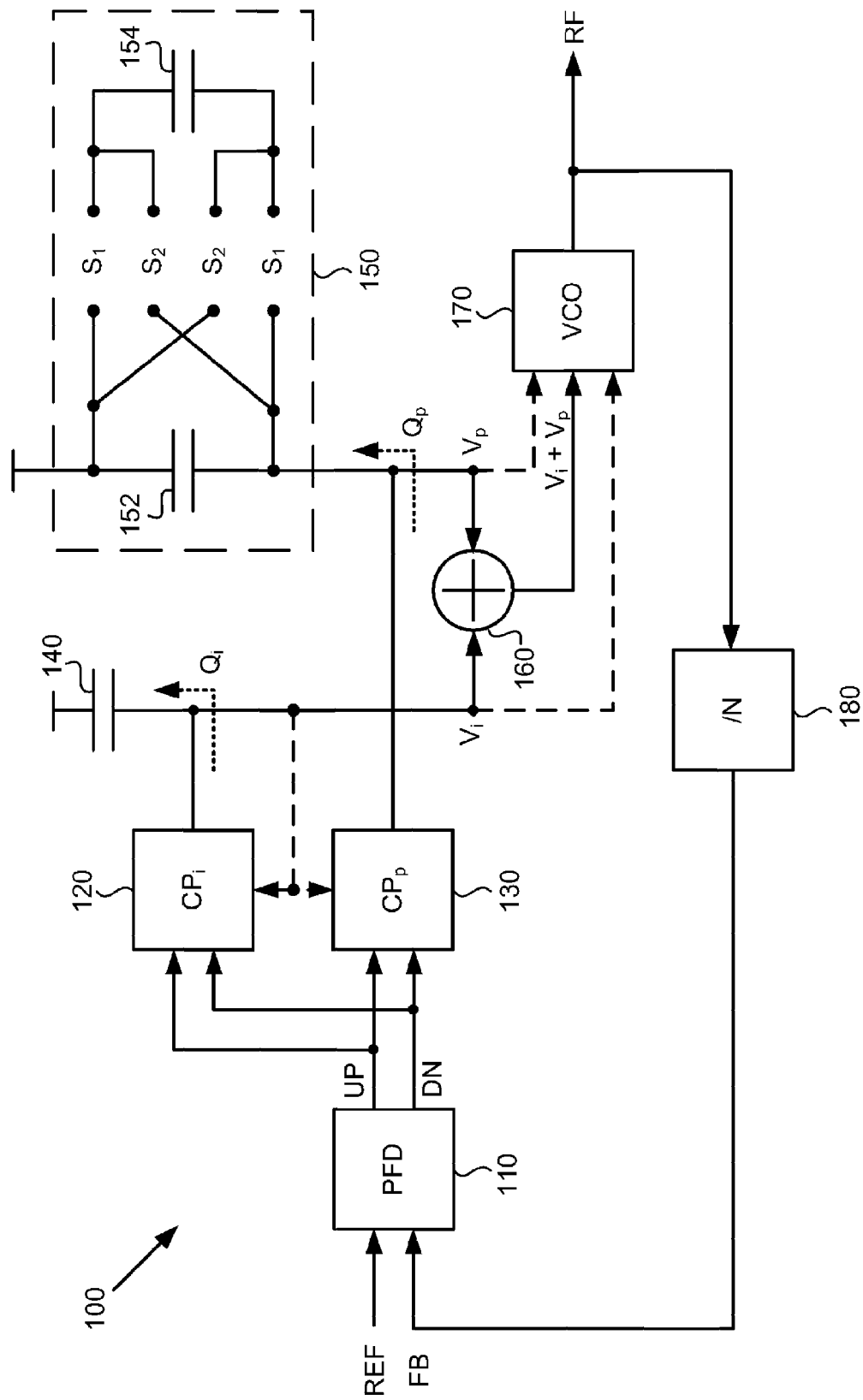
FIG. 1 illustrates an example mutual-charge canceling sample-reset (MCSR) loop filter phase locked loop (PLL), according to one embodiment.

FIG. 1 illustrates an example mutual-charge canceling sample-reset (MCSR) loop filter phase locked loop (PLL) 100. The MCSR loop filter PLL 100 includes a phase-frequency detector (PFD) 110, an integral charge pump (CPi) 120, a proportional charge pump (CPp) 130, an integral capacitor (Ci) 140, an MCSR capacitor 150, a voltage combiner 160, a voltage controlled oscillator (VCO) 170, and a divider 180.

The PFD 110 compares the phase-frequency of a feedback clock to a reference clock. The feedback clock is the signal from the VCO 170 divided by the divider 180. The PFD 110 generates UP or DOWN pulses based on a comparison of the feedback clock and the reference clock. The generation of the UP or DOWN pulses is dependent on the VCO 170 design (e.g., what control voltage is referenced to). The pulse width of the UP or DN pulses are based on the amount of lead or lag between the clocks.

The CPi 120 provides or withdraws integral charge (Qi) into or from the Ci 140 according to the UP or DN signals received from the PFD 110. The amount of the Qi driven by the CPi 120 is based on the pulse width of the UP or DN signal. The Ci 140 keeps integrating the Qi from the CPi 120, and generates an integral voltage (Vi) corresponding to the entire charge accumulated in the Ci 140.

The CPp 130 provides or withdraws proportional charge (Qp) into or from the MCSR capacitor 150 according to the UP or DN signals received from the PFD 110. The amount of the Qp driven by the CPp 130 is based on the pulse width of the UP or DN signal. The MCSR capacitor 150 includes a primary proportional capacitor (Cp1) 152, a secondary proportional capacitor (Cp2) 154, and first and second switch pairs S1, S2. The Cp1 and Cp2 152, 154 are in parallel and should be of equal (or substantially equal) capacitance value. The first switch pair S1 provides a direct parallel coupling of the Cp1 152 and the Cp2 154 while the second switch pair S2 provides a reversed parallel coupling of the Cp1 152 and the Cp2 154.

The MCSR capacitor 150 receives and captures the Qp and generates a proportional voltage (Vp) based thereon. The Qp is captured in the MCSR capacitor 150 by exclusively turning on one of the first and second switch pairs S1, S2. The Qp is maintained in the MCSR capacitor 150 and the Vp is valid for one reference clock cycle. Both the first and second switch pairs S1, S2 remain turned off after capturing the Qp. After every Qp maintenance cycle (e.g., one reference clock cycle), the first and second switch pairs S1, S2 provide a discharging path to the Cp1 152 and the Cp2 154 by commutating the polarity of the Cp2 154. The discharging process occurs simultaneously (or substantially simultaneously) with the next cycle of capturing the Qp. The MCSR capacitor 150 provides a sample-reset scheme by mutually cancelling charges with the two equal (or substantially equal) proportional capacitors (Cp1 152, Cp2 154) on alternating cycles of the reference clock.

The operation of the MCSR capacitor 150 provides a proportional path gain in the form of the Vp by means of the Cp1 152 and the Cp2 154 responding to the Qp injected from the CPp 130. The MCSR capacitor 150 determines the proportional path gain as the amount of time the Qp is held in the MCSR capacitor 150, such that the proportional path gain can be linearly scaled by Tref/Cp, where Tref is the time period of the reference clock (input signal to the MCSR loop filter PLL 100) and Cp is the total capacitance in the parallel connection of the Cp1 152 and the Cp2 154.

The voltage combiner 160 sums the Vi and the Vp and provides the sum to the VCO 170. The VCO 170 adjusts the clock generated based thereon.

The nature of discrete time processing of the MCSR capacitor 150 enables the MCSR loop filter PLL 100 to achieve a high degree of reference clock feedthrough rejection. The MCSR loop filter PLL 100 realizes a pure second order system. The MCSR loop filter PLL 100 may provide separate Vi and/or Vp and the Vi and/or the Vp may optionally be fed (dotted lines indicate optional) separately to the VCO 170 and/or the Vi may optionally be fed to the CPi 120 and/or the CPp 130 for specific PLL architectures (e.g., self-biased PLL) or VCO architectures (e.g., symmetric load ring oscillator).

Figure 2:
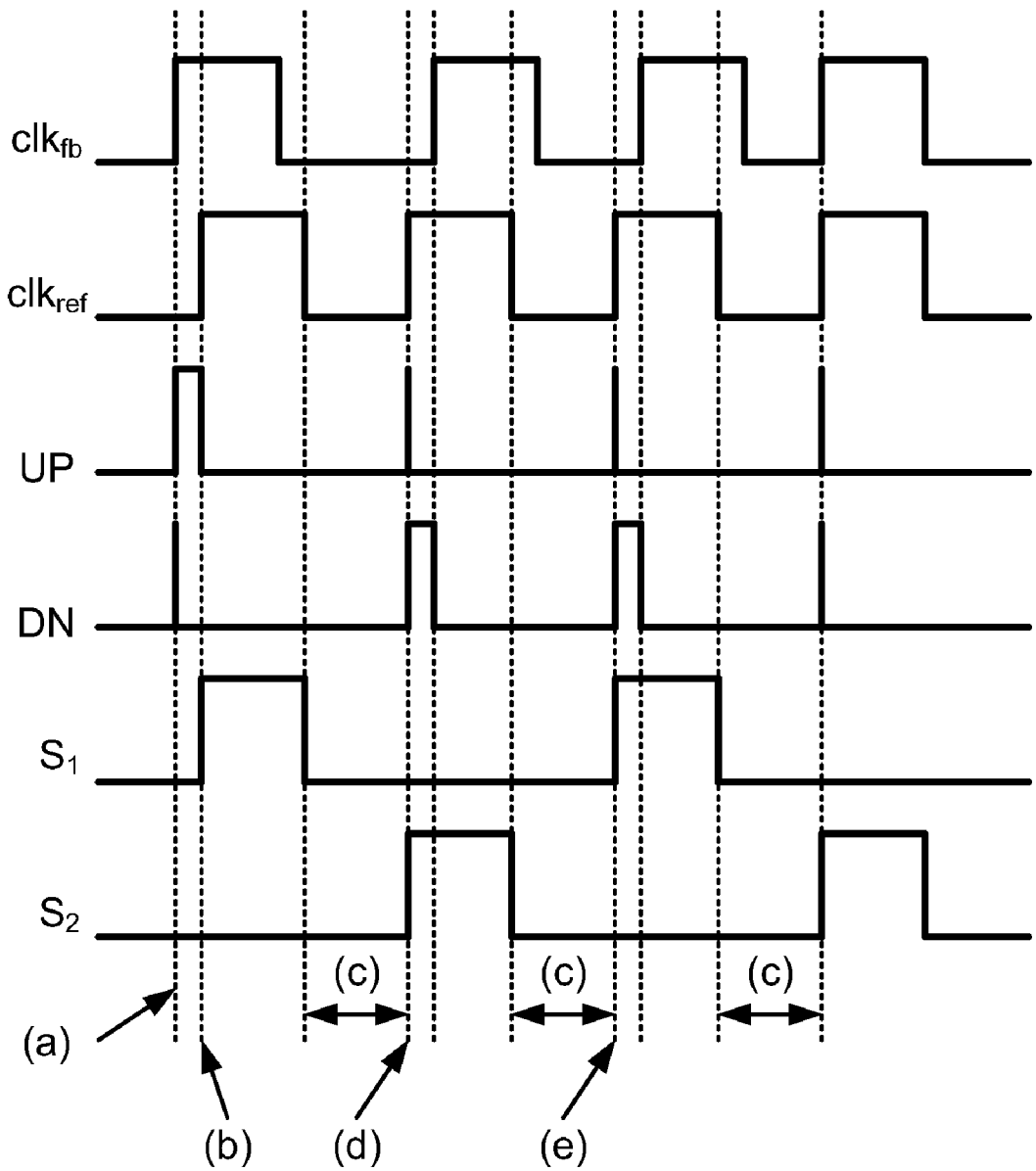
FIG. 2 illustrates an example timing diagram of an MCSR capacitor, according to one embodiment.
Figure 3:
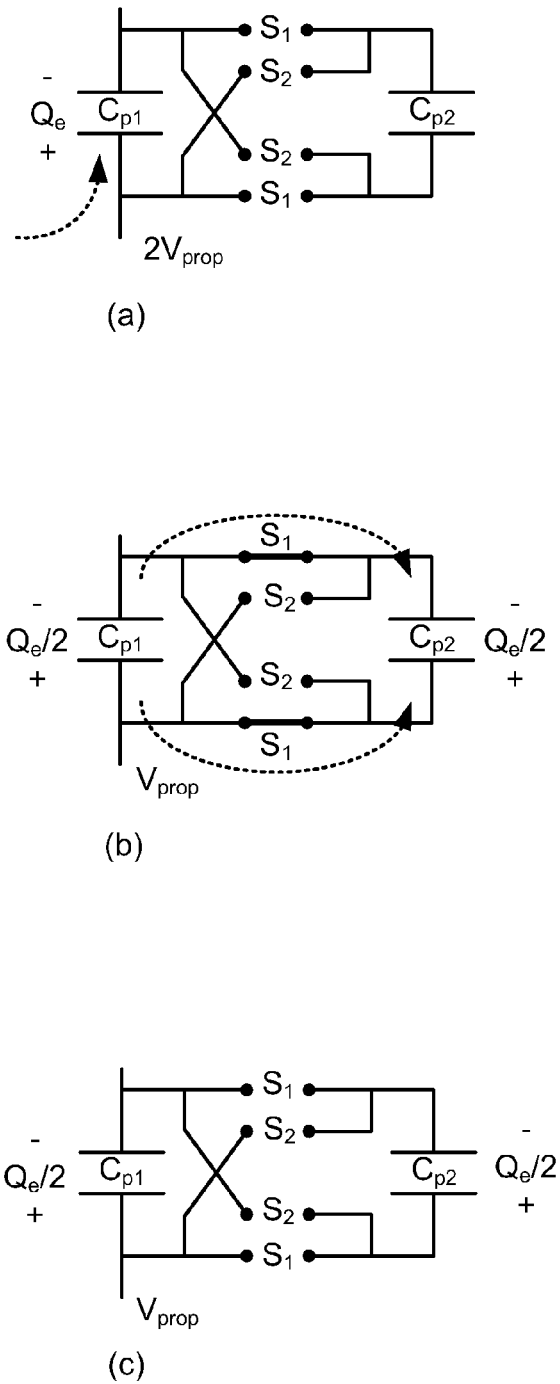
FIG. 3 illustrates an example operational implementation of the MCSR capacitor, according to one embodiment.
Figure 3:
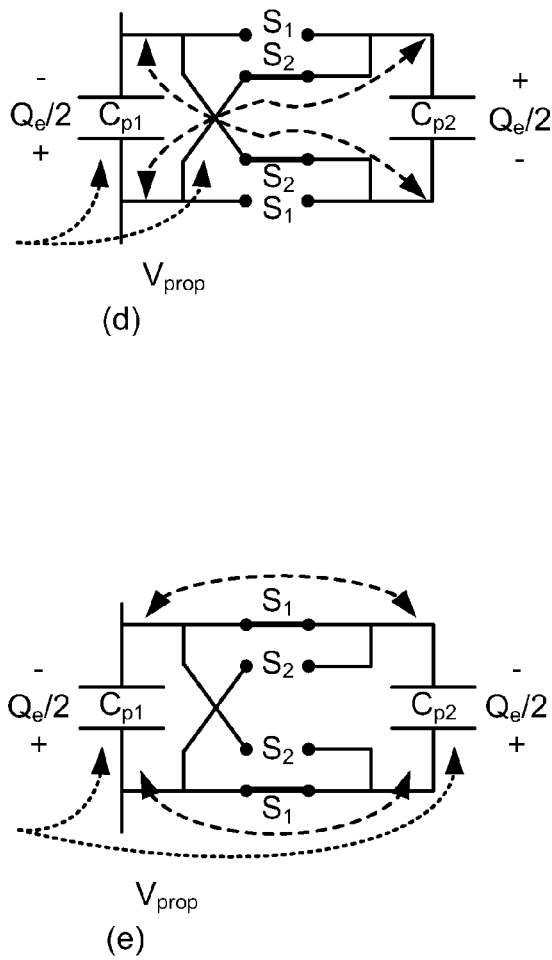

FIGS. 2 and 3 in conjunction with one another illustrate the example operation of a MCSR capacitor (150 of FIG. 1). FIG. 2 illustrates an example timing diagram depicting the activation of the switch pairs S1, S2 based on comparison of the reference signal and feedback signal and the PFD signals (UP, DN) generated therefrom. FIG. 3 illustrates an example status of the switch pairs S1, S2 at the different times identified and the operation of the Cp1 (152) and the Cp2 (154) based thereon. It should be noted that the generation of the UP and DOWN signals based on the clock comparison in FIG. 2 could be changed based on implementation of the VCO generating the feedback signal without departing from the scope.

At point (a) the rising edge of the feedback clock is detected prior to the reference clock so the PFD (e.g., 110 of FIG. 1) initiates an UP signal. At this point, both switch signals remain inactive so that both the switch pairs S1, S2 are off, and all of the charge (Qe) from the CPp (e.g., 130) is injected into the Cp1. At point (b) the rising edge of the reference signal is detected and the PFD deactivates the UP signal and the first switch pair S1 are activated (closed). The activation of the first switch pair S1 provides a connection of the Cp2 to the Cp1. When the Cp2 is bridged to the Cp1, the Qe is shared among them so that each has half the Qe (Qe/2). It should be noted that Qe corresponds to Qp in FIG. 1.

During a first period (c) the falling edge of the reference clock is detected and the first switch S1 signal is deactivated. Both the feedback and the reference clock signals are inactive so that the PFD is not generating any UP or DN signals and both switch signals are inactive so that both the switch pairs S1, S2 are off. When both the switch pairs S1, S2 are open the Cp2 is isolated from the Cp1 so that the charge (Qe/2) captured in each is maintained. At point (d) the rising edge of the reference clock is detected so the PFD activates a DN signal and the second switch pair S2 is activated (closed). When the second switch pair S2 is closed, the polarity of the Cp2 is reversed and attached to the Cp1. Changing the polarity and bridging enables the charge (Qe/2) trapped in the Cp1 and the Cp2 to cancel out. Meantime, the Cp1 and the Cp2 are recharged based on the charge from the CPp.

During a second period (c) the falling edge of the reference clock is detected and the second switch pair S2 is deactivated (open) so that both the switch pairs S1, S2 become open. Deactivating both the switch pairs S1, S2 separates the Cp2 from the Cp1, and the charge (Qe/2) stored in each is maintained. It should be noted that the second period (c) is not illustrated separately in FIG. 3. At point (e) the rising edge of the reference clock is detected so the PFD activates a DN signal and the first switch pair S1 is closed. When the first switch pair S1 is closed, the polarity of the Cp2 is reversed and attached to the Cp1. Changing the polarity and bridging enables the charge (Qe/2) trapped in the Cp1 and the Cp2 to cancel out. Meantime, the Cp1 and the Cp2 are recharged based on the charge from the CPp.

It should be noted that between the point (a) and the point (b) when both switch pairs S1, S2 are open that the instantaneous proportional voltage (Vp) may become double the expected value (e.g., 2Vp). Once one of the switch pairs S1, S2 turns on, the resetting and charge sharing between the Cp1 and the Cp2 occurs. The temporal doubling of the proportional control voltage may incur instantaneous phase error in the PLL (though its negative impact is negligible in steady state). If both switch pairs S1, S2 were accidentally turned on simultaneously the PLL may incur stability issues and increase uncertainty in the loop dynamics. In order to prevent this occurrence, between sampling operations the Cp2 may be disconnected from the Cp1. The isolation of the Cp2 does not change the Vp held in the Cp1 so the MCSR capacitor 150 is able to maintain the Vp for the entire reference clock cycle.

Figure 4:
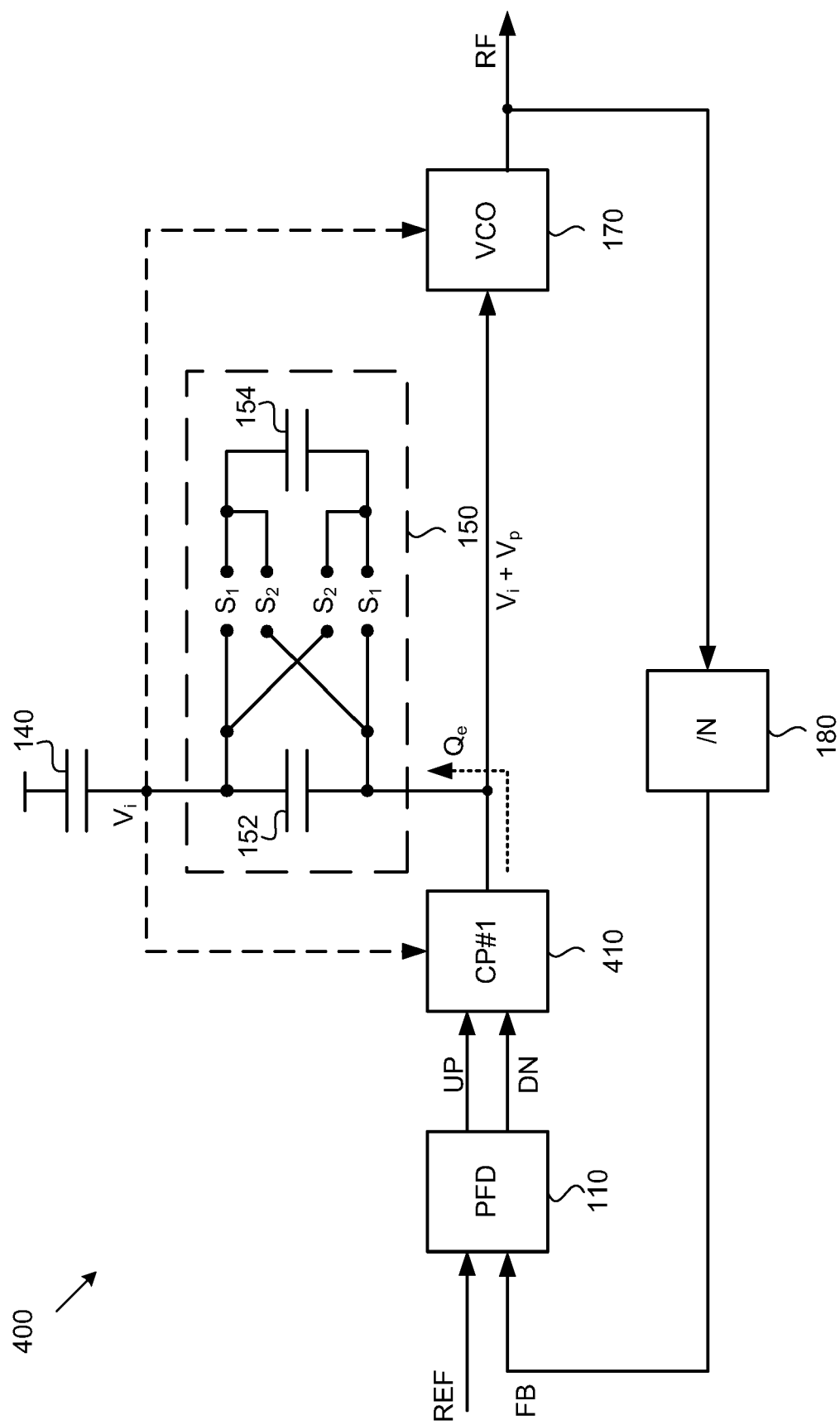
FIG. 4 illustrates an example MCSR loop filter PLL, according to one embodiment.

FIG. 4 illustrates an example MCSR loop filter PLL 400 having a single CP 410 and the Ci 140 in series with the MCSR 150. The CP 410 receives the UP and DN signals from the PFD 110 and provides an injection charge (Qe) based thereon. Since both the Ci 140 and the MCSR capacitor 150 are driven by the single CP 410, the Qe corresponds to both the Qi and the Qp of FIG. 1. Stacking the Ci 140 and the MCSR capacitor 150 in series realizes the voltage combining operation without a voltage combiner (e.g., 160). The reduction in the number of CPs (2 to 1) and the absence of the voltage combiner save power dissipation and area.

The MCSR loop filter PLL 400 may optionally provide a separate Vi that may be fed (dotted lines indicate optional) to the CP 410 and/or the VCO 170 for specific PLL architectures (e.g., self-biased PLL) or certain VCO architectures (e.g., symmetric load ring oscillator).

The loop dynamics of the MCSR loop filter PLL 400 is mainly determined by ratio of the Vi to the Vp. The ratio of the capacitance of the Ci 140 to the total capacitance of the Cp1 152 and the Cp2 154 corresponds to the ratio of the Vi to the Vp. As the proportional path gain is normally much higher than the integral path gain the Cp1 152 and the Cp2 154 are required to be much smaller than the integral Ci 140. Therefore the capacitors may become a design limiter.

Figure 5:
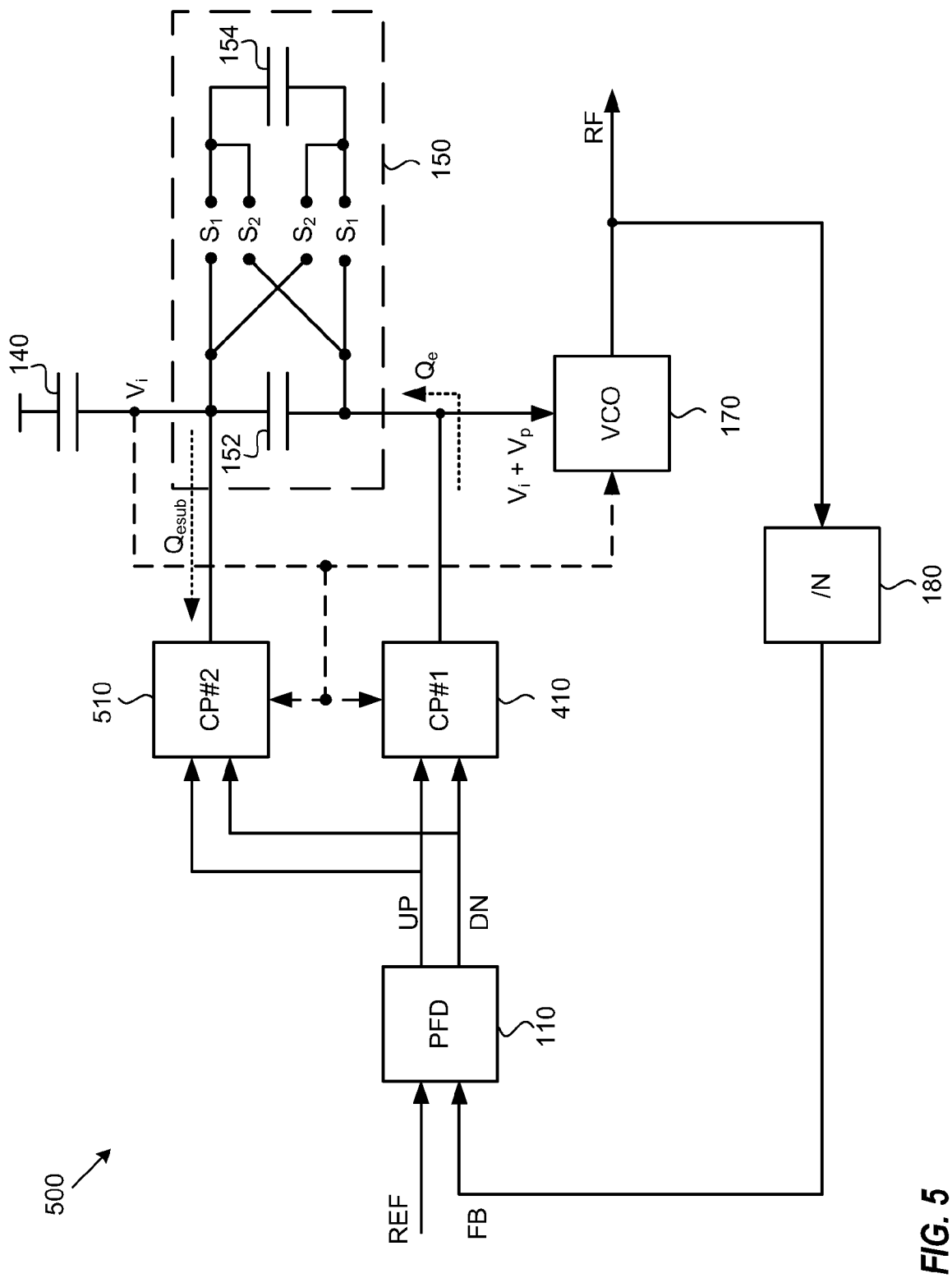
FIG. 5 illustrates an example MCSR loop filter PLL, according to one embodiment.

FIG. 5 illustrates an example MCSR loop filter PLL 500 having a second CP 510. The second CP 510 receives the UP and DN signals from the PFD 110 and provides a charge (Qesub) based thereon in the opposite direction of the Qe from the first CP 410. The Qesub from the second CP 510 is a fraction of the Qe from the first CP 220. The second CP 220 reduces the overall charge (Qe-Qesub) into the Ci 140 and reduces the integral path gain in form of an integral voltage (Vi) without increasing the size of the integral capacitor Ci 140. The second CP 510 may be utilized to bypass some portion of the Qe from the first CP 410 and accordingly adjust the ratio of the amount of charge in (and associated size of) the Ci 140 and the Cp1 152 and the Cp2 154. Utilizing the second CP 510 provides more design flexibility in the selection of the size of the capacitors Ci 140, Cp1 152, Cp2 154. The use of the second CP 510 may result in extra power dissipation.

For example, the use of the second CP 510 may enable the MCSR loop filter PLL 500 to be implemented with relatively uniform size capacitors Ci 140, Cp1 152, Cp2 154. The use of uniform size capacitors Ci 140, Cp1 152, Cp2 154 may improve device matching and result in higher yields.

The MCSR loop filter PLL 500 may optionally provide separate Vi that may be fed (dotted lines indicate optional) to the first CP 410, the second CP 510 and/or the VCO 170 for specific PLL architectures (e.g., self-biased PLL) and/or VCO architectures (e.g., symmetric load ring oscillator).

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. An apparatus comprising
a charge pump to receive pulses as input and to generate a charge based on the pulses; and
a mutual-charge canceling sample reset (MCSR) capacitor to receive the charge from charge pump and a reference clock, to cancel charge previously captured therein and to capture the received charge during each cycle of the reference clock, and to generate a proportional voltage based on the charge captured therein at end of each cycle of the reference clock and to output the proportional voltage, wherein the MCSR capacitor includes
a first proportional capacitor;
a second proportional capacitor having substantially identical capacitance value as and in parallel with the first proportional capacitor;
a first switch pair to provide a direct parallel coupling of the first proportional capacitor and the second proportional capacitor;

a second switch pair to provide a reversed parallel coupling of the first proportional capacitor and the second proportional capacitor.

2. The apparatus of claim 1, wherein the received charge is captured in the MCSR capacitor by exclusively turning on one of the first and second switch pairs responsive to the reference clock, and wherein the received charge is maintained in the MCSR capacitor by turning both the first and the second switch pairs off, and wherein half of the received charge is stored in each of the first and the second proportional capacitors.

3. The apparatus of claim 1, wherein the first and the second switch pairs alternatively turn on and off based on the reference clock so that a respective one of the first and the second switch pairs coupling the first and the second proportional capacitors alternates each cycle of the reference clock, and wherein alternating the respective one turned on reverses polarity of the second proportional capacitor and enables the charge previously captured in the first proportional capacitor to cancel the charge previously captured in the second proportional capacitor and vice versa.

4. The apparatus of claim 3, wherein the received charge is captured in the first and the second proportional capacitors while the charge previously captured therein is canceled.

5. The apparatus of claim 1, wherein the proportional voltage is generated as amount of time the received charge is maintained in the MCSR capacitor.

6. The apparatus of claim 1, further comprising an integral capacitor to receive the charge from the charge pump and to integrate the received charge.

7. The apparatus of claim 6, wherein the charge pump includes a first charge pump to generate a proportional charge and a second charge pump to generate an integral charge, wherein the MCSR capacitor is to receive the proportional charge and the integral capacitor is to receive the integral charge.

8. The apparatus of claim 6, wherein the integral capacitor is in series with the MCSR capacitor and receives the charge from the charge pump via the MCSR capacitor.

9. The apparatus of claim 8, wherein the charge pump includes a first charge pump to generate a first charge and a second charge pump to generate a second charge in opposite direction of the first charge, wherein the MCSR capacitor is to receive the first charge and the integral capacitor is to receive the first charge and the second charge.

10. The apparatus of claim 9, wherein size of the first and second proportional capacitors with respect to size of the integral capacitor is flexible.

11. An apparatus comprising
a phase frequency detector (PFD) to receive a reference clock as input, to compare the reference clock to a generated clock signal, and to generate a comparison signal based thereon;
a charge pump (CP) to receive the comparison signal and to generate a charge based thereon;
a mutual-charge canceling sample reset (MCSR) capacitor to receive the charge from the CP, to capture the received charge as a proportional charge and cancel previously captured proportional charge during each cycle of the reference clock, and to generate a proportional voltage based on the proportional charge at end of each cycle of the reference clock, wherein the MCSR capacitor includes
a first proportional capacitor;
a second proportional capacitor having substantially identical capacitance value to the first proportional capacitor and is parallel to the first proportional capacitor;
a first set of switches to provide a direct parallel coupling of the first and the second proportional capacitors; and
a second set of switches to provide a reverse parallel coupling of the first and the second proportional capacitors, wherein the first set of switches and the second set of switches alternatively turn on and off each cycle of the reference clock so that a respective one of the first and the second set of switches coupling the first and the second proportional capacitors alternates each cycle of the reference clock; and
an integral capacitor to receive the charge from the CP, to integrate the received charge and to generate an integral voltage based on the integrated charge; and
a voltage controlled oscillator (VCO) to receive the integral voltage and the proportional voltage, to generate the clock signal based thereon, and to output the clock signal.

12. The apparatus of claim 11, wherein the alternating the respective one of the first and the second set of switches turned on reverses polarity of the second proportional capacitor and enables the previously captured proportional charge stored in the first and the second proportional capacitors to cancel each other, and wherein the received charge is captured in the first and the second proportional capacitors while the canceling is occurring.

13. The apparatus of claim 11, wherein the integral capacitor is in series with the MCSR capacitor and receives the charge from the CP via the MCSR capacitor.

14. The apparatus of claim 13, wherein the charge pump includes a first charge pump to generate a first charge and a second charge pump to generate a second charge in opposite direction of the first charge, wherein the MCSR capacitor is to receive the first charge and the integral capacitor is to receive the first charge and the second charge.

15. The apparatus of claim 14, wherein size of the integral capacitor and the first and second proportional capacitors is flexible.

* * * * *